(12) United States Patent
Li et al.

(10) Patent No.: US 6,822,513 B1
(45) Date of Patent: Nov. 23, 2004

(54) SYMMETRIC AND COMPLEMENTARY DIFFERENTIAL AMPLIFIER

(75) Inventors: Zhongmin Li, Pocatello, ID (US); Bryce Rasmussen, Pocatello, ID (US)

(73) Assignee: AMI Semiconductor, Inc., Pocatello, ID (US)

(*) Notice: Subject to any disclaimer, the term of this patent is extended or adjusted under 35 U.S.C. 154(b) by 0 days.

(21) Appl. No.: 10/446,306

(22) Filed: May 28, 2003

(51) Int. Cl.⁷ .............................................. H03F 3/45
(52) U.S. Cl. ...................................... 330/253; 330/261
(58) Field of Search ............................. 330/252, 253, 330/257, 261; 327/359

(56) References Cited

U.S. PATENT DOCUMENTS

| | | | | |
|---|---|---|---|---|
| 4,797,631 A | * | 1/1989 | Hsu et al. ...................... 330/253 |
| 4,958,133 A | | 9/1990 | Bazes .......................... 330/253 |
| 5,337,008 A | | 8/1994 | Badyal ......................... 330/253 |
| 5,894,245 A | * | 4/1999 | Cho ............................ 330/253 |
| 6,043,708 A | * | 3/2000 | Barr ........................... 330/253 |
| 6,052,025 A | * | 4/2000 | Chang et al. .................. 330/253 |
| 6,278,323 B1 | | 8/2001 | Bazes .......................... 330/257 |
| 6,469,579 B2 | | 10/2002 | Bazes .......................... 330/253 |
| 6,586,990 B2 | * | 7/2003 | Udo et al. ...................... 330/9 |
| 6,628,168 B2 | * | 9/2003 | Martin et al. ................. 330/253 |

OTHER PUBLICATIONS

Paul R. Gray / Robert G. Meyer, Analysis and Design of Analog Integrated Circuits.
A Very High–Frequency CMOS Complementary Folded Cascode Amplifier, Richard E. Vallee and Ezz I. El–Masry IEEE Journal of Solid–State Circuits, vol. 29, No. 2, Feb. 1994 pp. 130–133.
Two Novel Fully Complementary Self–Based CMOS Differential Amplifiers, Mel Bazes 1991 IEEE, pp. 165–168.

* cited by examiner

*Primary Examiner*—Henry Choe
(74) *Attorney, Agent, or Firm*—Workman Nydegger

(57) ABSTRACT

A complementary differential amplifier includes two differential amplifiers. Each differential amplifier includes two input FETs (or bipolar transistors) having gate terminals coupled to the input terminals of the complementary differential amplifier. Two current load p-type field-effect transistors are each coupled in series between one voltage source and a drain terminal of a respective input FET. A current source FET is coupled in series between a common source terminal of the two input n-type field-effect transistors and a low voltage source. Only two FETs are needed to bias all of the current load and source FETs. A complementary folded cascode stage as well as an inverter stage may also be included.

7 Claims, 5 Drawing Sheets

SYMMETRIC AND COMPLEMENTARY DIFFERENTIAL AMPLIFIER

BACKGROUND OF THE INVENTION

1. The Field of the Invention

The present invention relates to analog circuits, and more specifically to Complementary Metal-Oxide-Semiconductor (CMOS) differential amplifiers.

2. Background and Related Art

Analog circuits have revolutionized the way people work and play and have contributed enormously to the advancement of humankind. A key component of many analog circuit designs is the amplifier. A differential amplifier has two input terminals and at least one output terminal. In a differential-input to single-output amplifier, the differential amplifier generates a signal at its output terminal that has a magnitude that is roughly proportional to the difference between the magnitudes of the signals at its input terminals. In the differential-input to differential-output amplifier, the differential amplifier generates a signal on its two output terminals such that the difference between the magnitudes of the output signals is roughly proportional to the difference between the magnitudes of the input signals.

CMOS differential amplifiers are constructed of a number of interconnected transistors. Some transistors are of one carrier type often called n-type Field Effect Transistors (i.e., nFETs), while other transistors are of the opposite carrier type often called p-type Field Effect Transistors (i.e., pFETs). In normal operation, Field Effect Transistors (FETs) generally have two modes of operation, linear and saturation. The mode of operation for a specific FET will depend on the voltages applied on its source, drain, and gate terminals as well as its threshold voltage.

The proper functioning of the CMOS differential amplifier often depends heavily on ensuring that at least some of the FETs are operating in a particular mode of operation. In order to ensure this, it is often necessary to generate a particular bias voltage that is different than the high and low voltages (often termed Vdd and Vss, respectively) that are supplied to the circuit as a whole. The particular bias voltage(s) are then applied to the gate terminals of the appropriate FETs.

In conventional CMOS differential amplifiers, separate voltage biases are used for the current source FETs, current load pair FETs, and cascade stage FETs. Furthermore, separate bias voltages may be used for FETs of different carrier types (i.e., n-type versus p-type). Accordingly, bias mechanisms for conventional CMOS differential amplifiers may be quite complex thereby using excessive layout area and increasing overall power consumption. Furthermore, the external biases often do not work under all circumstances. For instance, an external bias for the cascode transistors in complementary cascode structures rarely works because the gain and output resistance of a differential amplifier may both be very high and difficult to model accurately.

Other conventional CMOS differential amplifiers use self-biasing mechanisms that incorporate negative feedback. However, in those mechanisms, either the transistors for current sources or loads are biased in their linear mode instead of the saturation mode. This results in reduced voltage gain. Alternatively, the bias current level achieved using reasonable size of transistors is too small to obtain usable gain, especially when the supply voltage is small. Another negative impact is that when the input slew rate is high, because of the complicated interaction between the self-biasing and other parts of the circuitry, the proper operation of the amplifier can be disabled.

Accordingly, what would be advantageous is a CMOS differential amplifier that allows for a more simplified biasing mechanism.

BRIEF SUMMARY OF THE INVENTION

The foregoing problems with the prior state of the art are overcome by the principles of the present invention which are directed towards a complementary CMOS differential amplifier that includes two differential amplifiers.

A first differential amplifier includes two input n-type Field-Effect Transistors (nFETs) having gate terminals coupled to the input terminals of the complementary differential amplifier. Two current load p-type Field-Effect Transistors (pFETs) are each coupled in series between a high voltage source and a drain terminal of a respective input nFET. A current source nFET is coupled in series between a common source terminal of the two input nFETs and a low voltage source.

A second differential amplifier includes two input pFETs having gate terminals also coupled to the input terminals of the complementary differential amplifier. Two current load nFETs are each coupled in series between the low voltage source and a drain terminal of a respective input pFET. A current source pFET is coupled in series between a common source terminal of the two input pFETs and the high voltage source.

This configuration allows for a far less complex biasing mechanism than conventional CMOS complementary differential amplifiers. The biasing mechanism may include a single diode-connected nFET and a single diode connected pFET. The drain terminal of the bias nFET and the bias pFET are coupled together. The source terminal of the bias pFET is coupled to the high voltage source, while the source terminal of the bias nFET is coupled to the low voltage source. In order to properly bias, the gate terminal of the bias pFET is coupled to the gate terminals of the two current load pFETs and to the current source pFET. The gate terminal of the bias nFET is coupled to the gate terminals of the two current load nFETs and to the current source nFET.

Accordingly, since only two bias transistors are needed to provide all of the bias voltage, the biasing mechanism is less complex and requires less design layout and draws less current. Also, in this configuration, the biased FETs operate in the saturation region for all input voltages, thereby guaranteeing high gain and low power consumption.

A complementary folded cascode stage may be added to this complementary different amplifier to further increase gain. The folded cascode stage includes two nFETs and two pFETs. The source terminals of the two cascode pFETs are each coupled to a drain terminal of a respective current load pFET. The source terminals of the two cascoded nFETs are each coupled to a drain terminal of a respective current load nFET. The gate terminals of each of the four cascode FETs are shared in common and coupled to the drain terminals of one of the cascode pFET and NFET pairs. In this configuration, no additional biasing voltage is needed while the cascode FETs operate in a guaranteed saturation region. The drain terminal of one of the cascode pFETs is coupled to the drain terminal of one of the cascode nFETs. The drain terminal of the other cascode pFET is coupled to the drain terminal of the other cascode nFET.

An inverter stage may be added in which the gate terminal of the inverter FETs are coupled to each other and to the common drain terminal of one of the cascode pFET and nFET pairs.

This configuration has other advantages in addition to the reduced complexity of the bias mechanism mentioned above. For example, the complementary CMOS differential amplifier has a high common-mode rejection ratio, a cascode stage that has reduced sensitivity to variations in supply voltage, process and temperature. Furthermore, the differential amplifier has rail-to-rail common mode range.

In particular, when the input common-mode is above mid-rail (i.e., above the average of the high voltage source and the low voltage source), the first differential amplifier provides most of the gain of the complementary CMOS differential amplifier. On the other hand, when the input common-mode is below mid-rail, the second differential amplifier provides most of the gain of the complementary CMOS differential amplifier. The further gain provided by the cascode stage significantly reduces the bias current needed to maintain a high speed. This further reduces power consumption even for high speed applications. The inverter may be used to drive a rail-to-rail output to thereby drive digital circuitry.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
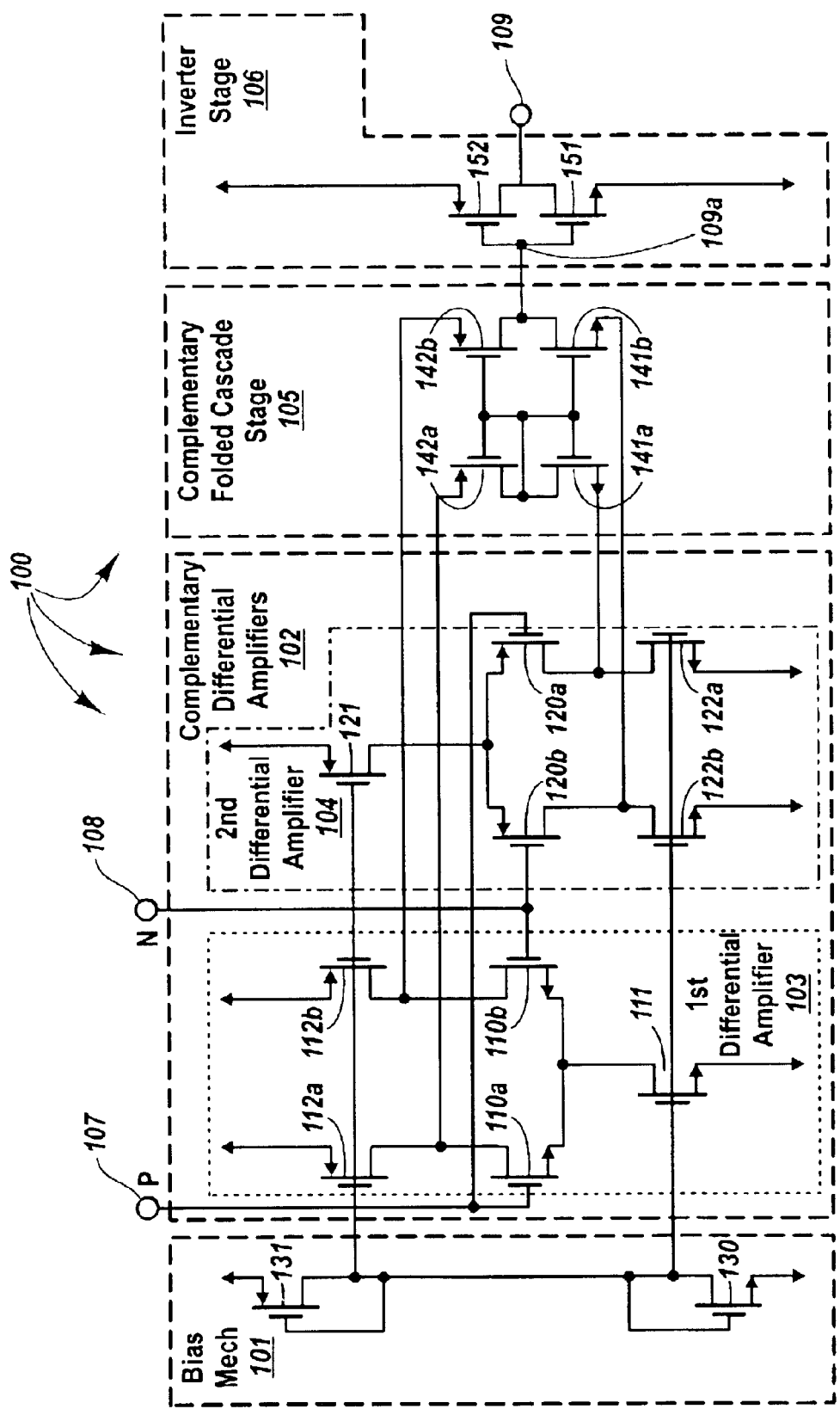
FIG. 1 illustrates a complementary differential amplifier that is constructed of Field-Effect Transistors (FETs) in accordance with a first embodiment of the present invention.

FIG. 1 illustrates an amplifier 100 that is constructed of Field-Effect Transistors (FETs). The amplifier includes a pair of complementary differential amplifiers 102 including a first differential amplifier 103 and a second differential amplifier 104. The amplifier 100 includes two input terminals 107 and 108 and one output terminal 109.

The first differential amplifier 103 is composed of FETs 110a, 110b, 111, 112a and 112b. N-type FETs (nFETs) 110a and 110b are input transistors having their gate terminals coupled to respective input terminals 107 and 108 of the amplifier 100. Accordingly, the nFETs 110a and 110b represent the first differential pair.

The first differential amplifier 103 includes a current source nFET 111 having its drain terminal coupled to a common source terminal of the input nFETs 110a and 110b, and has its source terminal coupled to a low voltage source such as the low supply voltage Vss. The low supply voltage Vss may be zero, negative, or even positive with respect to ground. In this description and in the claims, two nodes in a circuit are "coupled" if a voltage difference between the two nodes would cause charge to flow between the two nodes even if with some resistance. The current source nFET 111 configured in this manner significantly improves common-mode rejection if properly biased in the saturation region.

The first differential amplifier 103 also includes two current load pFETs 112a and 112b which act as the load of the first differential pair input nFETs 110a and 110b, respectively. The source terminals of the two current load pFETs 112a and 112b are coupled to a high voltage source such as a high supply voltage Vdd. The high supply voltage Vdd may be zero, positive, or even negative with respect to ground. The drain terminal of the current load pFET 112a is coupled to the drain terminal of the input nFET 110a, while the drain terminal of the current load pFET 112b is coupled to the drain terminal of the input nFET 110b. For optimal operation, the two current load pFETs 112a and 112b should be biased to be in the saturation region.

When the input common-mode is above mid-rail (i.e., above the average of the high and low voltage sources), the first differential amplifier 103 provides most of the differential voltage gain of the complementary differential amplifiers 102 assuming that the current source nFET 111 and the current load pFETs 112a and 112b are operating in the saturation region.

The second differential amplifier 104 is composed of FETs 120a, 120b, 121, 122a and 122b. pFETs 120a and 120b are input transistors having their gate terminals also coupled to respective input terminals 107 and 108 of the amplifier 100. Accordingly, the pFETs 120a and 120b represent the second differential pair.

The second differential amplifier 104 includes a current source pFET 121 having its drain terminal coupled to a common source terminal of the input pFETs 120a and 120b, and having its source terminal coupled to the high voltage source. The current source pFET 121 configured in this manner also significantly improves common-mode rejection if properly biased in the saturation region.

The second differential amplifier 104 also includes two current load nFETs 122a and 122b which act as the load of the second differential pair input pFETs 120a and 120b, respectively. The source terminals of the two current load nFETs 122a and 122b are coupled to the low voltage source. The drain terminal of the current load nFET 122a is coupled to the drain terminal of the input pFET 120a, while the drain terminal of the current load nFET 122b is coupled to the drain terminal of the input pFET 120b. Once again, for optimal operation, the two current load nFETs 122a and 122b should be biased to be in the saturation region.

When the input common-mode is below mid-rail, the second differential amplifier 104 provides most of the differential voltage gain of the complementary differential amplifiers 102 assuming that the current source pFET 121 and the current load nFETs 122a and 122b are operating in the saturation region. Whether the input common-mode is above-rail or below rail, the differential voltage gain of the complementary differential amplifiers 102 as a whole will be relatively constant across rail-to-rail input common-mode voltage range assuming that the current source nFET 111, the current load pFETs 112a and 112b, the current source pFET 121, and the current load nFETs 122a and 122b are operating in the saturation region.

The bias mechanism 101 ensures that each of these specified MOSFETs 11, 112a, 112b, 121, 122a and 122b are operating in the saturation region. This is accomplished using just two FETs 130 and 131. The bias nFET 130 has its source terminal coupled to a low voltage source, and has its gate terminal coupled to its own drain terminal. Likewise, bias pFET 131 has its source terminal coupled to a high voltage source, and has its gate terminal coupled to its own drain terminal. The drain terminal of the bias nFET 130 is coupled to the drain terminal of the pFET 131. The gate terminals of each of the current source nFET 111, the current load pFETs 112a and 112b, the current source pFET 121, and the current load nFETs 122a and 122b are coupled to the common drain terminal between bias nFET 130 and bias pFET 131.

The bias mechanism 101 which includes only two FETs 130 and 131 contrasts sharply with the biasing mechanism in many conventional amplifiers. The reduced complexity of the bias mechanism 101 allows for significantly reduced layout area and power consumption, while fully accomplishing the proper setting of all relevant FETs in their saturation region across rail-to-rail input and output ranges. Furthermore, since the relevant FETs are appropriately biased in the saturation region for all input voltages, the amplifier 100 has high gain with reduced power consumption and high speed.

In order to provide yet further gain, a complementary folded cascode stage 105 may be included after the complementary differential amplifiers 102 stage. The complementary folded cascode stage 105 includes four FETs including two nFETs 141a and 141b and two pFETs 142a and 142b. The source terminal of the cascode nFET 141a is coupled to the common drain terminal between the input pFET 120a and the current load nFET 122a. The source terminal of the cascode nFET 141b is coupled to the common drain terminal between the input pFET 120b and the current load nFET 122b. The source terminal of the cascode pFET 142a is coupled to the common drain terminal between the input nFET 110a and the current load pFET 112a. The source terminal of the cascode pFET 142b is coupled to the common drain terminal between the input nFET 110b and the current load pFET 112b.

The four FETs 141a, 141b, 142a and 142b are self-biased in that their gate terminals are coupled together. This self-biasing ensures that the four FETs 141a, 141b, 142a and 142b are biased in the saturation region and thereby are not sensitive to variations in supply voltage, process and temperature. Also, the further gain provided by the cascode stage 105 reduces the amount of bias current needed to maintain a given high speed, thereby further reducing power consumption.

The output terminal 109A of the cascode stage 105 may be viewed as the output terminal of the entire amplifier 100. However, in order to drive a digital circuit, the output terminal 109A of the cascode stage may be coupled to an inverter stage 106. The inverter stage 106 includes an nFET 151 and a pFET 152 that each have their gate terminal coupled to the output terminal 109A. The source terminal of the pFET 152 is coupled to a high voltage source, while the source terminal of the nFET 151 is coupled to a low voltage source. The drain terminals of the nFET 151 and pFET 152 are coupled together and to the output terminal 109 of the inverter stage 106. The presence of the inverter stage 106 allows for rail-to-rail voltage swing at the output terminal 109.

Figure 2:
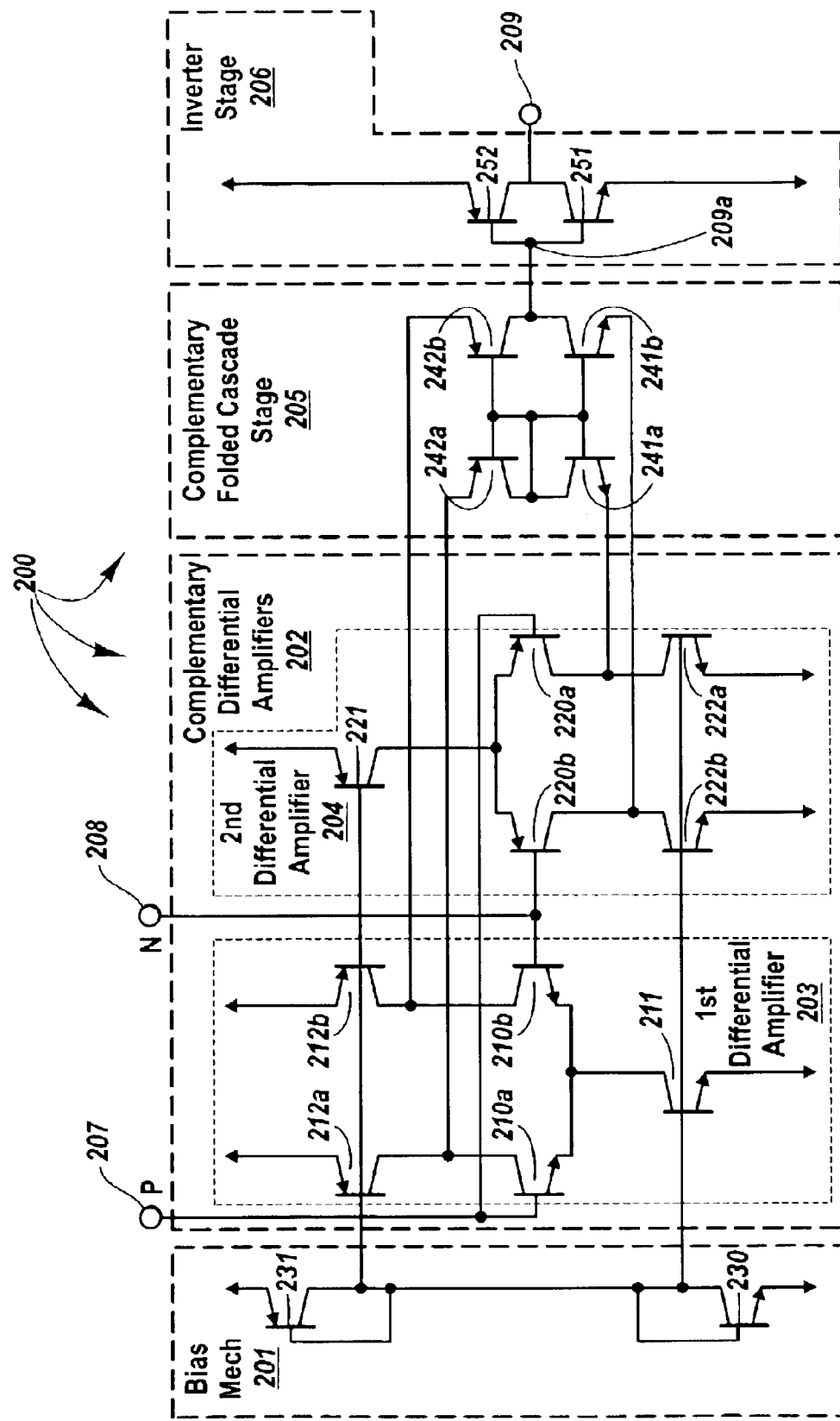
FIG. 2 illustrates a complementary differential amplifier that is constructed of bipolar transistors in accordance with a second embodiment of the present invention.

The FETs described above may be any Field-Effect Transistor in which a conductor serves as a gate terminal, and a dielectric serves to separate the gate terminal from an underlying semiconductor material. The FET may be, for example, a Metal Oxide Semiconductor FET (MOSFET). The transistors need not even be Field-Effect Transistors. For instance, FIG. 2 illustrates an amplifier 200 that is similar to the amplifier 100 of FIG. 1, except that bipolar transistors 210a, 210b, 211, 212a, 212b, 220a, 220b, 221, 222a, 222b, 230, 231, 241a, 241b, 242a, 242b, 251, and 252 replace corresponding FETs in FIG. 1. Of course, base terminals, emitter terminals, and collector terminals of the bipolar transistors replace respective gate terminals, source terminals, and drain terminals of the corresponding FET. Bias mechanism 201, complementary differential amplifier 202, first differential amplifier 203, second differential amplifier 204, complementary folded cascode stage 205, and inverter stage 206 replace their corresponding elements 101 through 106 of FIG. 1.

Figure 3:
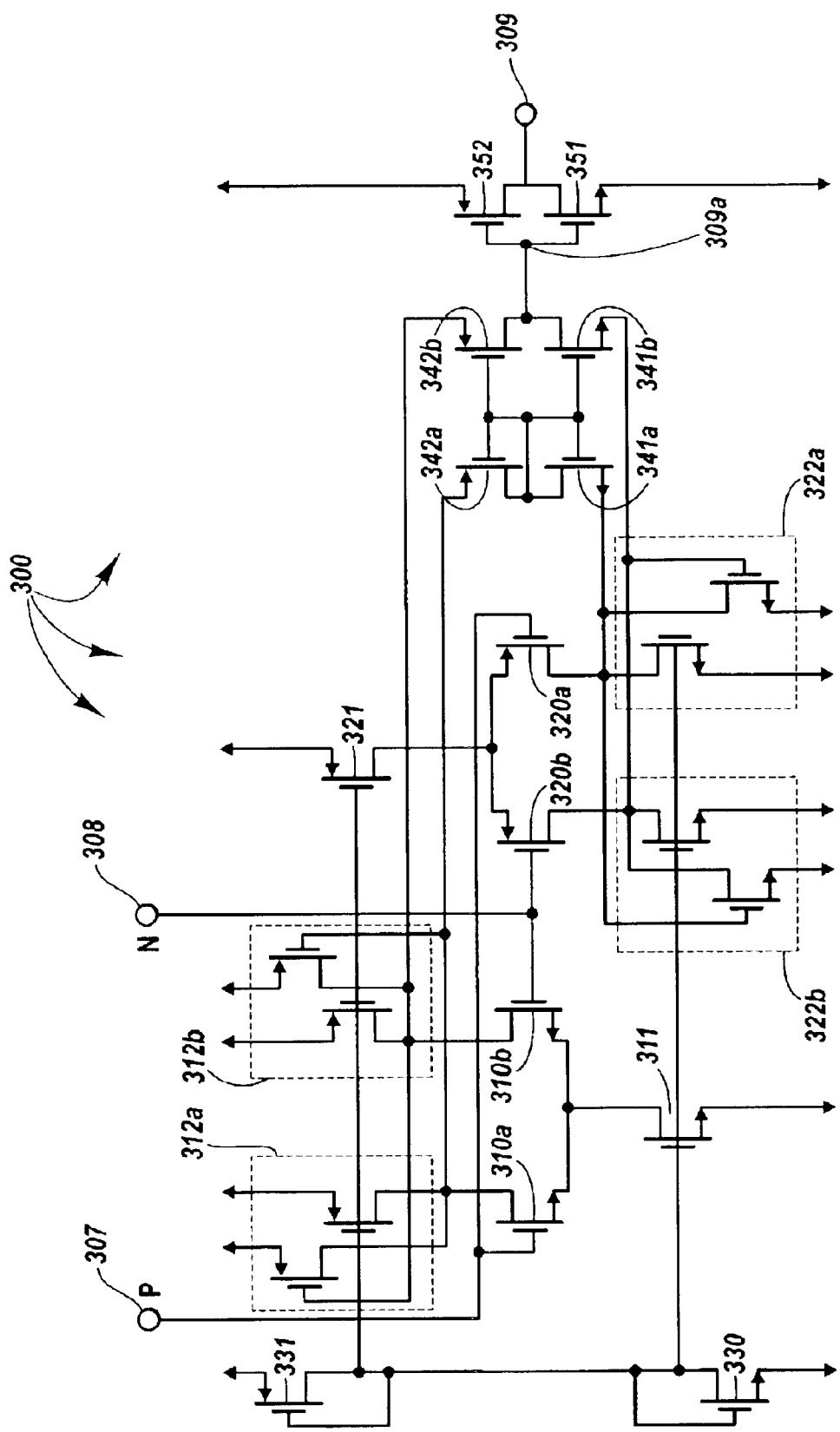
FIG. 3 illustrates a complementary differential amplifier with hysteresis that is constructed of Field-Effect Transistors (FETs) in accordance with a third embodiment of the present invention.

FIG. 3 illustrates an amplifier 300 that is similar to the amplifier 100 of FIG. 1, except that the amplifier 300 includes hysteresis. Hysteresis is introduced by replacing FETs 112a–b and 122a–b of FIG. 1 with block 312a–b and 322a–b, respectively. Each block includes an additional FET that has its drain terminal coupled in common with the original current load FET. The additional FET has its gate terminal coupled to the drain terminal of the opposite input FET in the corresponding differential pair.

Figure 4:
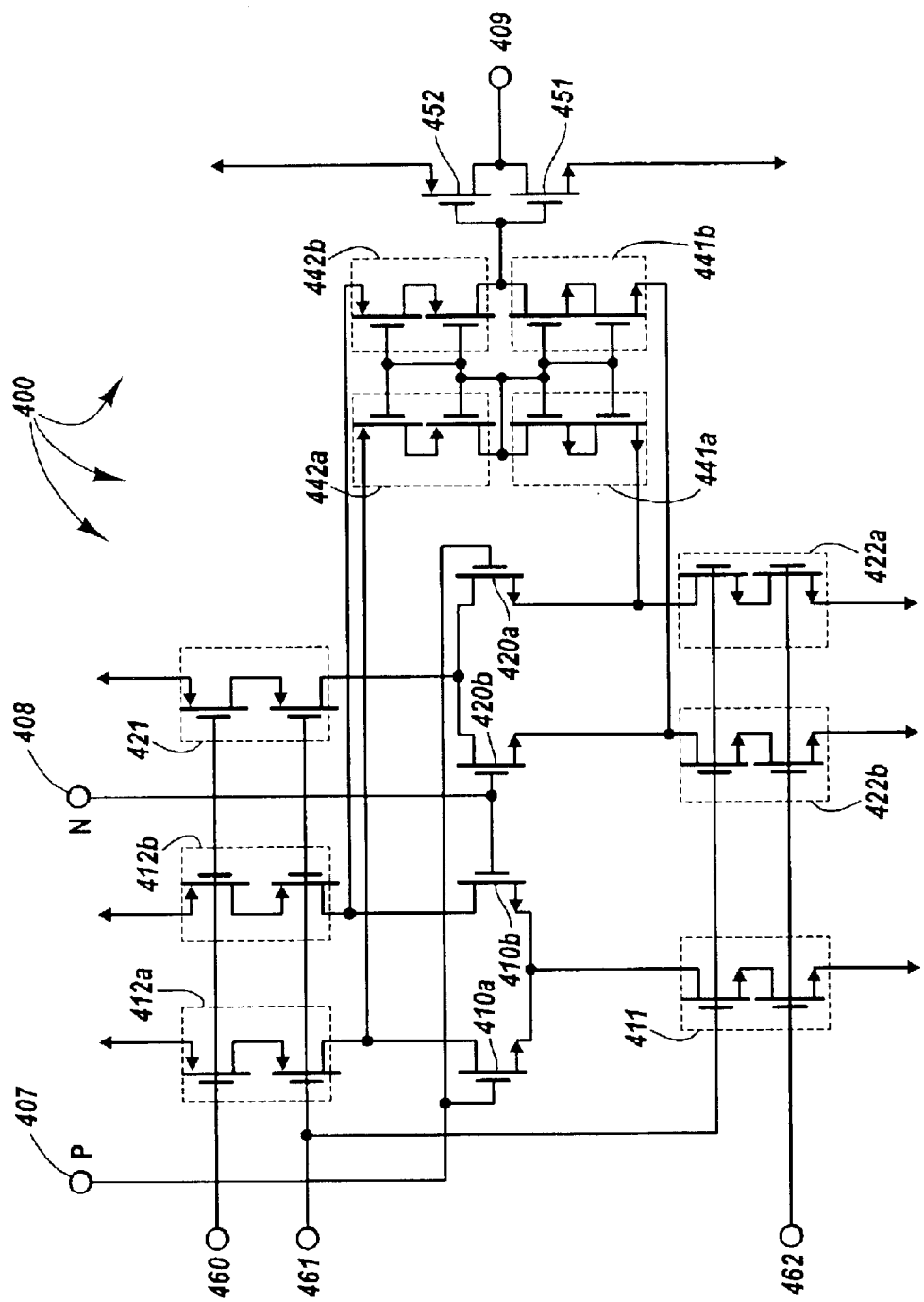
FIG. 4 illustrates a complementary differential amplifier that is constructed of Field-Effect Transistors (FETs) in accordance with a fourth embodiment of the present invention.

FIG. 4 illustrates an amplifier 400 that is similar to the amplifier 100 of FIG. 1, but with increased gain and common-mode rejection ratio. This increased gain and common-mode rejection ratio is accomplished by replacing the FETs 111,112a–b,121,122a–b, 141a–b, and 142a–b with corresponding cascode FET pairs 411, 412a–b, 421, 422a–b, 441a–b, 442a–b.

Figure 5:
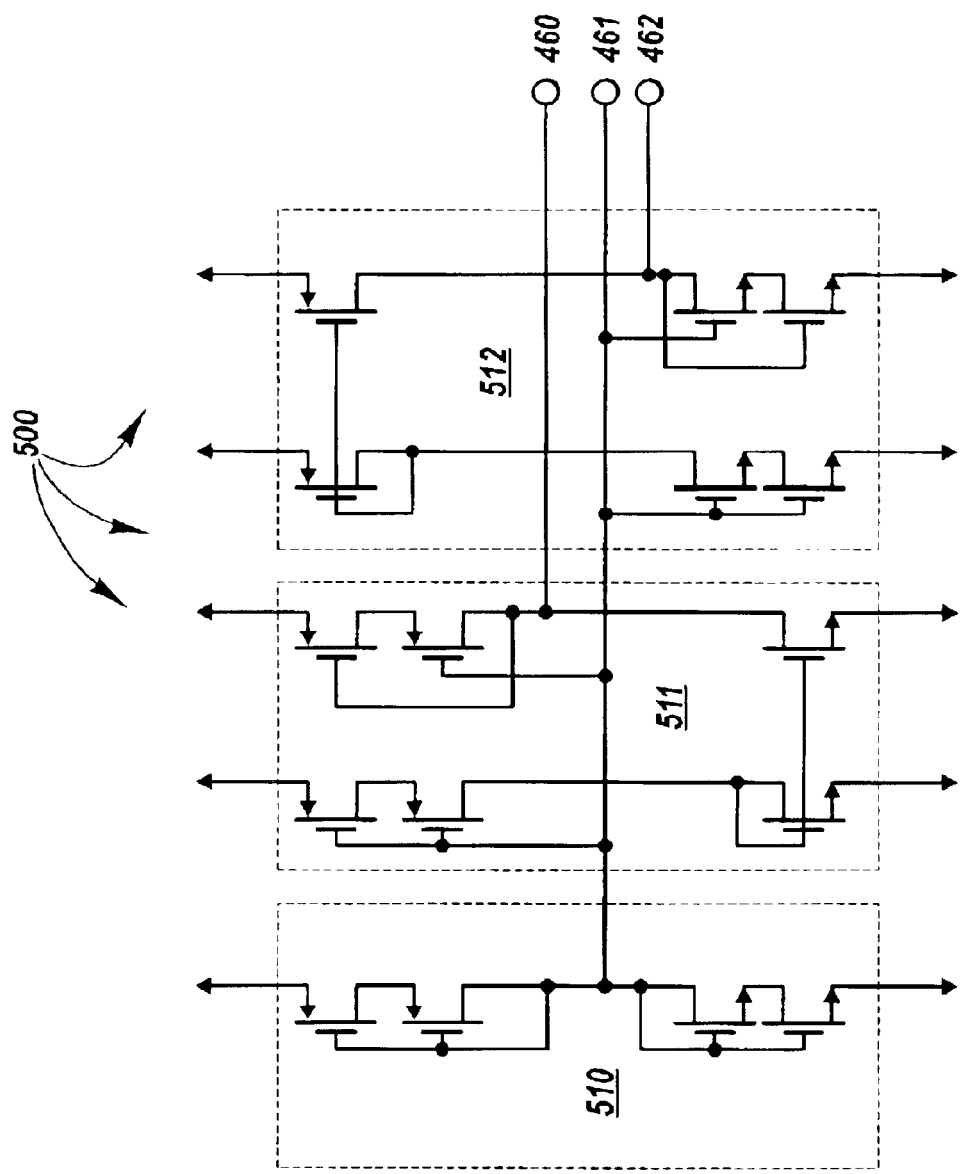
FIG. 5 illustrates a bias generator that is constructed of Field-Effect Transistors (FETs) and that may be used for the complementary differential amplifier of the fourth embodiment of the present invention.

A bias generator suitable for biasing the cascoded amplifier 400 is illustrated as bias generator 500 in FIG. 5 and include individual bias generators 510, 511 and 512.

The bias generator 510 is used to generate a potential 461 for cascode FETs. For the cascode nFETs, the potential 461 is one threshold voltage plus two times the overdrive voltage above the low voltage source. For the cascode pFETs, the potential 461 is the same amount below the high voltage source. The bias generator 511 is used to generate a potential 460 which is one threshold voltage plus one overdrive voltage below the high voltage source for the cascode pFETs. The bias generator 512 is used to generate a potential 462 which is one threshold voltage plus one overdrive voltage above the low voltage source for the cascode nFETs.

The cascode pFET biased by the potential 460 and the cascode nFET biased by the potential 462 will be right on the edge of saturation region. The bias potentials 460, 462 and 461 maximize the headroom seen by the input differential pairs FETs 410a–b and 420a–b. The headroom is between two times the overdrive voltage below the high voltage source and the same amount above the low voltage source. The bias generator 510 maximizes overdrive voltage for a given supply voltage level and therefore maximizes the speed of designs which utilize this invention. Compared with other bias generators, bias generators 510, 511 and 512 still collectively make up a simple generator for cascode type differential amplifiers.

In summary, the differential amplifier configuration described above allows for a simplified bias mechanism to thereby reduce layout area and power consumption. Furthermore, a self-biased cascode stage may further increase gain while keeping power consumption low. An inverter stage allows the system to drive digital circuitry.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A differential amplifier comprising the following:
   a first differential amplifier comprising:
      first and second input n-type field-effect transistors;
      first and second current load p-type field-effect transistors, a source terminal of each of the first and second current load p-type field-effect transistors coupled to a high voltage source, a drain terminal of the first current load p-type field-effect transistor coupled to a drain terminal of the first input n-type field-effect transistor, and a drain terminal of the second current load p-type field-effect transistor coupled to a drain terminal of the second input n-type field-effect transistor; and
      a current source n-type field-effect transistor having a drain terminal coupled to a source terminal of both the first and second input n-type field-effect transistors, the current source n-type field-effect transistor having a source terminal coupled to a low voltage source;
   a second differential amplifier comprising:
      first and second input p-type field-effect transistors, a gate terminal of the first input p-type field-effect transistor coupled to a gate terminal of the first n-type field-effect transistor, a gate terminal of the second input p-type field-effect transistor coupled to a gate terminal of the second input n-type field-effect transistor,
      first and second current load n-type field-effect transistors, a source terminal of each of the first and second current load n-type field-effect transistors coupled to the low voltage source, a drain terminal of the first current load n-type field-effect transistor coupled to a drain terminal of the first input p-type field-effect transistor, and a drain terminal of the second current load n-type field-effect transistor coupled to a drain terminal of the second input p-type field-effect transistor; and
      a current source p-type field-effect transistor having a drain terminal coupled to a source terminal of both the first and second input p-type field-effect transistors, the current source p-type field-effect transistor having a source terminal coupled to the high voltage source;
   a first hysteresis inducing p-type field-effect transistor having a drain terminal coupled to the drain terminal of the first current load p-type field-effect transistor, having a source terminal coupled to a high voltage source, and having a gate terminal coupled to a drain terminal of the second input n-type field-effect transistor;
   a second hysteresis inducing p-type field-effect transistor having a drain terminal coupled to the drain terminal of the second current load p-type field-effect transistor, having a source terminal coupled to a high voltage source, and having a gate terminal coupled to a drain terminal of the first input n-type field-effect transistor;
   a first hysteresis inducing n-type field-effect transistor having a drain terminal coupled to the drain terminal of the first current load n-type field-effect transistor, having a source terminal coupled to a low voltage source, and having a gate terminal coupled to a drain terminal of the second input p-type field-effect transistor; and
   a second hysteresis inducing n-type field-effect transistor having a drain terminal coupled to the drain terminal of the second current load n-type field-effect transistor, having a source terminal coupled to a low voltage source, and having a gate terminal coupled to a drain terminal of the first input p-type field-effect transistor.

2. A differential amplifier further comprising the following:
   a first differential amplifier comprising:
      first and second input n-type field-effect transistors;
      first and second current load p-type field-effect transistors, a source terminal of each of the first and second current load p-type field-effect transistors coupled to a high voltage source, a drain terminal of the first current load p-type field-effect transistor coupled to a drain terminal of the first input n-type field-effect transistor, and a drain terminal of the second current load p-type field-effect transistor coupled to a drain terminal of the second input n-type field-effect transistor, and
      a current source n-type field-effect transistor having a drain terminal coupled to a source terminal of both the first and second input n-type field-effect transistors, the current source n-type field-effect transistor having a source terminal coupled to a low voltage source;
   a second differential amplifier comprising:
      first and second input p-type field-effect transistors, a gate terminal of the first input p-type field-effect transistor coupled to a gate terminal of the first n-type field-effect transistor, a gate terminal of the second input p-type field-effect transistor coupled to a gate terminal of the second input n-type field-effect transistor,
      first and second current load n-type field-effect transistors, a source terminal of each of the first and second current load n-type field-effect transistors coupled to the low voltage source a drain terminal of the first current load n-type field-effect transistor coupled to a drain terminal of the first input p-type field-effect transistor, and a drain terminal of the second current load n-type field-effect transistor coupled to a drain terminal of the second input p-type field-effect transistor; and
      a current source p-type field-effect transistor having a drain terminal coupled to a source terminal of both the first and second input p-type field-effect transistors the current source p-type field-effect transistor having a source terminal coupled to the high voltage source;
   a first cascode current load p-type field-effect transistor having a drain terminal coupled to the source terminal of the first current load p-type field-effect transistor, having a source terminal coupled to a high voltage source, and having a gate terminal coupled to a first biasing voltage that keeps the first cascoded current load p-type field effect transistor operating in the saturation region;
   a second cascode current load p-type field-effect transistor having a drain terminal coupled to the source terminal of the second current load p-type field-effect transistor, having a source terminal coupled to a high voltage source, and having a gate terminal coupled to the first biasing voltage;
   a cascode current source p-type field-effect transistor having a drain terminal coupled to the source terminal of the current source p-type field-effect transistor, having a source terminal coupled to a high voltage source, and having a gate terminal coupled to the first biasing voltage;

a first cascode current load n-type field-effect transistor having a drain terminal coupled to the source terminal of the first current load n-type field-effect transistor, having a source terminal coupled to a low voltage source, and having a gate terminal coupled to a second biasing voltage that keeps the first cascoded current load n-type field effect transistor operating in the saturation region;

a second cascode current load n-type field-effect transistor having a drain terminal coupled to the source terminal of the second current load n-type field-effect transistor, having a source terminal coupled to a low voltage source, and having a gate terminal coupled to the second biasing voltage; and a cascode current source n-type field-effect transistor having a drain terminal coupled to the source terminal of the current source n-type field-effect transistor, having a source terminal coupled to a low voltage source, and having a gate terminal coupled to the second biasing voltage.

3. A differential amplifier comprising the following:

a first differential amplifier comprising:

first and second input n-type field-effect transistors;

first and second current load p-type field-effect transistors a source terminal of each of the first and second current load p-type field-effect transistors coupled to a high voltage source a drain terminal of the first current load p-type field-effect transistor coupled to a drain terminal of the first input n-type field-effect transistor, and a drain terminal of the second current load p-type field-effect transistor coupled to a drain terminal of the second input n-type field-effect transistor; and a current source n-type field-effect transistor having a drain terminal coupled to a source terminal of both the first and second input n-type field-effect transistors, the current source n-type field-effect transistor having a source terminal coupled to a low voltage source;

a second differential amplifier comprising:

first and second input p-type field-effect transistors, a gate terminal of the first input p-type field-effect transistor coupled to a gate terminal of the first n-type field-effect transistor, a gate terminal of the second input p-type field-effect transistor coupled to a gate terminal of the second input n-type field-effect transistor;

first and second current load n-type field-effect transistors, a source terminal of each of the first and second current load n-type field-effect transistors coupled to the low voltage source, a drain terminal of the first current load n-type field-effect transistor coupled to a drain terminal of the first input p-type field-effect transistor, and a drain terminal of the second current load n-type field-effect transistor coupled to a drain terminal of the second input p-type field-effect transistor; and a current source p-type field-effect transistor having a drain terminal coupled to a source terminal of both the first and second input p-type field-effect transistors, the current source p-type field-effect transistor having a source terminal coupled to the high voltage source;

means for biasing the current source p-type field-effect transistor, the current source n-type field-effect transistor, the first and second current load n-type field-effect transistors, and the first and second current load p-type field-effect transistors to all be in the saturation region, wherein the means for biasing comprises the following:

a bias n-type field-effect transistor having a gate terminal coupled to its drain terminal and to the gate terminals of all of the current source n-type field-effect transistor and the first and second current load p-type field-effect transistors, the bias n-type field-effect transistor having a source terminal coupled to the low voltage source; and a bias p-type field-effect transistor having a gate terminal coupled to its drain terminal and to the gate terminals of all of the current source p-type field-effect transistor and the first and second current load n-type field-effect transistors, the bias p-type field-effect transistor having a source terminal coupled to the high voltage source.

4. A differential amplifier comprising the following:

a first differential amplifier comprising:

first and second input n-type field-effect transistors;

first and second current load p-type field-effect transistors, a source terminal of each of the first and second current load p-type field-effect transistors coupled to a high voltage source, a drain terminal of the first current load p-type field-effect transistor coupled to a drain terminal of the first input n-type field-effect transistor, and a drain terminal of the second current load p-type field-effect transistor coupled to a drain terminal of the second input n-type field-effect transistor; and a current source n-type field-effect transistor having a drain terminal coupled to a source terminal of both the first and second input n-type field-effect transistors, the current source n-type field-effect transistor having a source terminal coupled to a low voltage source;

a second differential amplifier comprising:

first and second input p-type field-effect transistors a gate terminal of the first input p-type field-effect transistor coupled to a gate terminal of the first n-type field-effect transistor, a gate terminal of the second input p-type field-effect transistor coupled to a gate terminal of the second input n-type field-effect transistor;

first and second current load n-type field-effect transistors, a source terminal of each of the first and second current load n-type field-effect transistors coupled to the low voltage source, a drain terminal of the first current load n-type field-effect transistor coupled to a drain terminal of the first input p-type field-effect transistor, and a drain terminal of the second current load n-type field-effect transistor coupled to a drain terminal of the second input p-type field-effect transistor; and a current source p-type field-effect transistor having a drain terminal coupled to a source terminal of both the first and second input p-type field-effect transistors, the current source p-type field-effect transistor having a source terminal coupled to the high voltage source;

a bias n-type field-effect transistor having a gate terminal coupled to its drain terminal and to the gate terminals of all of the current source n-type field-effect transistor and the first and second current load p-type field-effect transistors, the bias n-type field-effect transistor having a source terminal coupled to the low voltage source; and a bias p-type field-effect transistor having a gate terminal coupled to its drain terminal and to the gate terminals of all of the current source p-type field-effect transistor and the first and second current load n-type field-effect transistors, the bias p-type field-effect transistor having a source terminal coupled to the high voltage source.

5. A differential amplifier in accordance with claim 4, further comprising a folded cascoded circuit comprising the following:

first and second cascode n-type field-effect transistors and first and second cascode p-type field-effect transistors, each of the gate terminals of the first and second cascode n-type field-effect transistors and the first and second cascode p-type field-effect transistors being coupled together, the source terminal of the first cascode p-type field-effect transistor coupled to the drain terminal of the first current load p-type field-effect transistor, the source terminal of the second cascode p-type field-effect transistor coupled to the drain terminal of the second current load p-type field-effect transistor, the source terminal of the first cascode n-type field-effect transistor coupled to the drain terminal of the first current load n-type field-effect transistor, the source terminal of the second cascode n-type field-effect transistor coupled to the drain terminal of the second current load n-type field-effect transistor.

6. A differential amplifier in accordance with claim 5, further comprising an inverter stage comprising the following:

an inverter n-type field-effect transistor and an inverter p-type field-effect transistor, each having a gate terminal coupled to the drain terminal of the second input p-type field-effect transistor, the drain terminal of the inverter n-type field-effect transistor and the inverter p-type field-effect transistor being coupled together, the source terminal of the p-type field-effect transistor being coupled to the high voltage source, and the source terminal of the n-type field-effect transistor being coupled to the low voltage source.

7. A differential amplifier comprising the following:

a first differential amplifier comprising:
first and second input n-type field-effect transistors:
first and second current load p-type field-effect transistors, a source terminal of each of the first and second current load p-type field-effect transistors coupled to a high voltage source, a drain terminal of the first current load p-type field-effect transistor coupled to a drain terminal of the first input n-type field-effect transistor, and a drain terminal of the second current load p-type field-effect transistor coupled to a drain terminal of the second input n-type field-effect transistor; and
a current source n-type field-effect transistor having a drain terminal coupled to a source terminal of both the first and second input n-type field-effect transistors, the current source n-type field-effect transistor having a source terminal coupled to a low voltage source;

a second differential amplifier comprising:
first and second input p-type field-effect transistors, a gate terminal of the first input p-type field-effect transistor coupled to a gate terminal of the first n-type field-effect transistor, a gate terminal of the second input p-type field-effect transistor coupled to a gate terminal of the second input n-type field-effect transistor;
first and second current load n-type field-effect transistors, a source terminal of each of the first and second current load n-type field-effect transistors coupled to the low voltage source, a drain terminal of the first current load n-type field-effect transistor coupled to a drain terminal of the first input p-type field-effect transistor, and a drain terminal of the second current load n-type field-effect transistor coupled to a drain terminal of the second input p-type field-effect transistor; and
a current source p-type field-effect transistor having a drain terminal coupled to a source terminal of both the first and second input p-type field-effect transistors, the current source p-type field-effect transistor having a source terminal coupled to the high voltage source;

a folded cascoded circuit comprising:
first and second cascode n-type field-effect transistors and first and second cascode p-type field-effect transistors, each of the gate terminals of the first and second cascode n-type field-effect transistors and the first and second cascode p-type field-effect transistors being coupled together, the source terminal of the first cascode p-type field-effect transistor coupled to the drain terminal of the first current load p-type field-effect transistor, the source terminal of the second cascode p-type field-effect transistor coupled to the drain terminal of the second current load p-type field-effect transistor, the source terminal of the first cascode n-type field-effect transistor coupled to the drain terminal of the first current load n-type field-effect transistor, the source terminal of the second cascode n-type field-effect transistor coupled to the drain terminal of the second current load n-type field-effect transistor; and an inverter stage comprising:
an inverter n-type field-effect transistor and an inverter p-type field-effect transistor, each having a gate terminal coupled to the drain terminal of the second input p-type field-effect transistor, the drain terminal of the inverter n-type field-effect transistor and the inverter p-type field-effect transistor being coupled together, the source terminal of the p-type field-effect transistor being coupled to the high voltage source, and the source terminal of the n-type field-effect transistor being coupled to the low voltage source.

* * * * *

UNITED STATES PATENT AND TRADEMARK OFFICE
CERTIFICATE OF CORRECTION

PATENT NO. : 6,822,513 B1
DATED : November 23, 2004
INVENTOR(S) : Zhongmin Li and Bryce Rasmussen It is certified that error appears in the above-identified patent and that said Letters Patent is hereby corrected as shown below:

<u>Title page,</u>
Item [56], References Cited, OTHER PUBLICATIONS, change "Self-Based" to -- Self-Biased --

<u>Column 2,</u>
Line 41, change "different" to -- differential --
Line 49, change "NFET" to -- nFET --

<u>Column 4,</u>
Line 67, after "MOSFETs" change "11" to -- 111 --

<u>Column 5,</u>
Lines 48, 51 and 54, change "109A" to -- 109a --

<u>Column 6,</u>
Line 30, change "include" to -- includes --

<u>Column 8,</u>
Line 35, after "source" insert -- , --
Line 45, before "the current source" insert -- , --

<u>Column 9,</u>
Line 25, before "a source terminal" insert -- , --
Line 27, after "voltage source" insert -- , --

UNITED STATES PATENT AND TRADEMARK OFFICE
CERTIFICATE OF CORRECTION

PATENT NO. : 6,822,513 B1
DATED : November 23, 2004
INVENTOR(S) : Zhongmin Li and Bryce Rasmussen It is certified that error appears in the above-identified patent and that said Letters Patent is hereby corrected as shown below:

Column 10,
Line 38, after "transistors" insert -- , --

Signed and Sealed this

Thirty-first Day of May, 2005

JON W. DUDAS
*Director of the United States Patent and Trademark Office*